United States Patent [19]

Yano et al.

[11] Patent Number: 4,694,461
[45] Date of Patent: Sep. 15, 1987

[54] SEMICONDUCTOR LASER ARRAY

[75] Inventors: Seiki Yano, Kashihara; Saburo Yamamoto, Nara; Sadayoshi Matsui, Tenri; Mototaka Taneya, Sakai, all of Japan

[73] Assignee: Sharp Kabushiki Kaisha, Osaka, Japan

[21] Appl. No.: 700,018

[22] Filed: Feb. 8, 1985

[30] Foreign Application Priority Data

Feb. 28, 1984 [JP] Japan .................................. 59-39144

[51] Int. Cl.$^4$ ................................................ H01S 3/19
[52] U.S. Cl. ........................................ 372/50; 372/45; 372/46
[58] Field of Search ................ 372/46, 50, 45; 357/17

[56] References Cited

FOREIGN PATENT DOCUMENTS 0024399 6/1981 Japan ..................................... 372/46

OTHER PUBLICATIONS

Blum et al, "Double Heterojunction Laser Arrays", IBM Technical Disclosure Bulletin, vol. 15, No. 7, Dec. 1972.

Primary Examiner—James W. Davie
Attorney, Agent, or Firm—Birch, Stewart, Kolasch & Birch

[57] ABSTRACT

A semiconductor laser array includes a p-GaAs substrate, a p-Ga$_{1-x}$Al$_x$As cladding layer, a Ga$_{1-y}$Al$_y$As active layer, an n-Ga$_{1-z}$Al$_z$As optical guide layer, an n-Ga$_{1-x}$Al$_x$As cladding layer and an n-GaAs cap layer formed by the liquid phase epitaxial growth method. A plurality of stripe shaped grooves are formed in the surface of the n-GaAs cap layer so that the bottom of the groove reaches the intermediate of the n-Ga$_{1-z}$Al$_z$As optical guide layer. A Ga$_{1-b}$Al$_b$As high resistance layer is filled in the plurality of stripe shaped grooves so that injecting current is divided into a plurality of paths, and each laser emitting region is optically, phase coupled to each other with a phase difference of zero degree.

7 Claims, 4 Drawing Figures

SEMICONDUCTOR LASER ARRAY

BACKGROUND OF THE INVENTION

1. Field of the Invention

The present invention relates to a semiconductor laser structure and, more particularly, to a semiconductor laser array which includes a current confinement structure and a bult-in refractive index difference, the refractive index being the vaule of the real part only.

2. Description of the Prior Art

A semiconductor laser has widely been used as a light source in an optical information processing system such as an optical disc system and a laser printer. Rapid processing is required in such an optical information processing system as the amount of information to be handled increases. To ensure rapid processing, the semiconductor laser must emit the laser beam at a high power level in a stable operating range. However, in the conventional semiconductor laser having a single active region, the practical maximum output is around 50 mW.

To enhance the output level, a laser device has been proposed, wherein a plurality of semiconductor lasers are aligned in a parallel fashion, and the plurality of semiconductor lasers are optically, phase coupled to each other so as to emit the laser beam in a single phase. This is referred to as the phase coupled laser array. However, in a semiconductor laser array of the gain guide type, the gain is substantially reduced at the coupling region positioned between the adjacent two laser emitting regions and, therefore, the electric field has the phase difference of 180 degrees at the adjacent two laser emitting regions. The far field pattern has a plurality of peaks as shown in FIG. 1. Thus, the semiconductor laser array of the gain guide type can not endure for practical use.

To improve the above-mentioned problems, a semiconductor laser array of the index guide type has been proposed. For example, D. E. Ackley et al of Hewlett-Packard Laboratories proposed a semiconductor laser array of the leaky mode built-in type (Appl. Phys. Letters, 39(1), July 1, 1981. P27). The proposed laser array ensures an effective coupling of the laser emitting regions, but has two peaks in the far field pattern because of the leaky mode.

D. Botez et al of RCA Laboratories proposed a CSP-LOC (Channeled-Substrate-Large-Optical-Cavity) laser (document of IOOC, 1983. 29B5-2). The proposed semiconductor laser utilizes the distribution of an effective refractive index which is formed by the coupling to the GaAs substrate. The region disposed between the adjacent two laser emitting regions has a high absorption coefficient. The refractive index difference is not obtained when the absorption coefficient is minimized. Accordingly, it is difficult to reduce the phase difference between the adjacent two laser emitting regions to zero.

D. E. Ackley et al of Hewlett-Packard Laboratories further proposed the semiconductor laser array of the ridge-type (Appl. Phys. Letters, 42(2), 15 January 1983. P152). Each pair of the adjacent two laser emitting regions has a phase difference of 180 degrees because of the high absorption caused by the electrode disposed at the coupling region of the adjacent two laser emitting regions.

OBJECTS AND SUMMARY OF THE INVENTION

Objects of the Invention

Accordingly, an object of the present invention is to provide a semiconductor laser array which ensures a stable operation and a high power output.

Another object of the present invention is to provide a semiconductor laser array of the index guide type, wherein the laser emitting regions are coupled to each other with a phase difference of zero degree.

Other objects and further scope of applicability of the present invention will become apparent from the detailed description given hereinafter. It should be understood, however, that the detailed description and specific examples, while indicating preferred embodiments of the invention, are, given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, each laser emitting region has the index guide structure including only the real part. The optical loss at the coupling region disposed between two adjacent laser emitting regions is minimized so that the phase difference at the two adjacent laser emitting regions is held to zero degree. The laser emission is at a high power in a stable operating mode.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
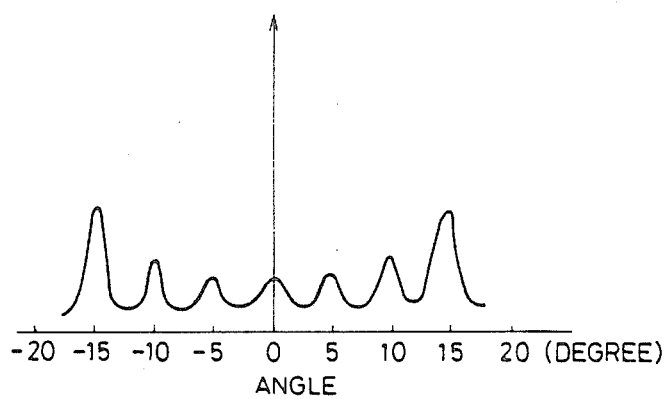
FIG. 1 is a graph showing the far field pattern of a semiconductor laser array of the gain guide type.
Figure 2:
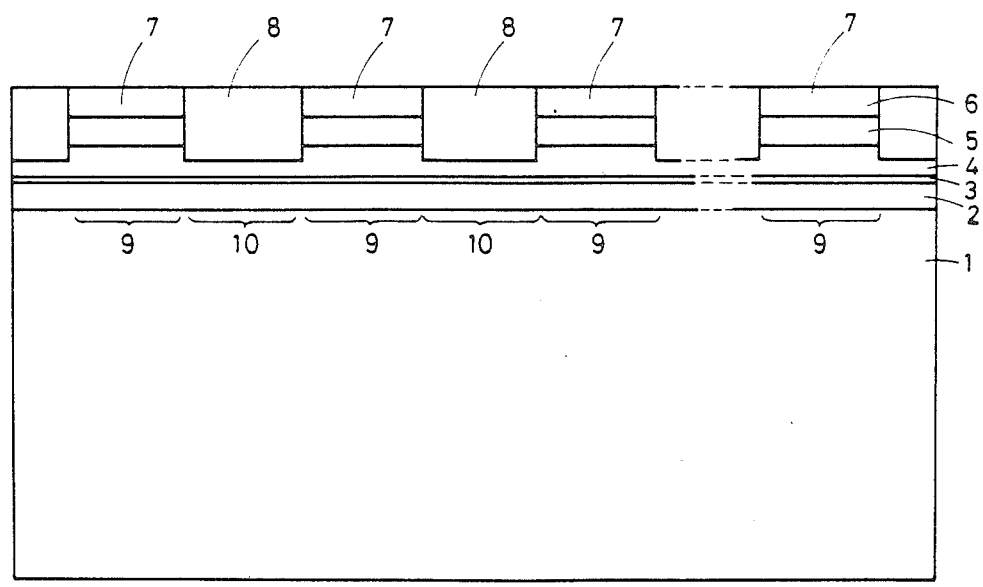
FIG. 2 is a sectional view of an embodiment of a semiconductor laser array of the present invention.

FIG. 2 shows an embodiment of a semiconductor laser array of the present invention. A semiconductor laser array of the present invention includes a p-GaAs substrate 1, a p-Ga$_{1-x}$Al$_x$As cladding layer 2 formed on the substrate 1, a Ga$_{1-y}$Al$_y$As active layer 3, an n-Ga$_{1-z}$Al$_z$As optical guide layer 4, an n-Ga$_{1-x}$Al$_x$As cladding layer 5, and an n-GaAs cap layer 6. The layers 2, 3, 4, 5 and 6 are sequentially formed on the p-GaAs substrate 1 by the well-known liquid-phase epitaxial growth method so as to form a multilayered laser emitting crystal of the double-hetero structure. An etching operation is effected to the multi-layered laser emitting crystal by the photo-lithography method so as to form a plurality of stripes 7 on the GaAs substrate 1. Each stripe 7 have a width of 4 μm, and the stripes 4 has a pitch of 8 μm. The etching is effected from the cap layer 6, and the etching depth is controlled so that the etched portion reaches the inside of the intermediate layer 4.

Each etched groove has a width of 4 μm. Thereafter, a Ga$_{1-b}$Al$_b$As high resistance layer 8 is formed in the etched groove through the use of the liquid-phase epitaxial growth method. The crystal formation temperature cycle is properly controlled so that the high resistance layer 8 is formed in the etched groove, but is not formed on the stripes 7.

The AlAs mole fractions of the respective layers must satisfy the following conditions.

$$y < z < x \quad (1)$$

$$z < b \quad (2)$$

An n-side electrode is formed on the surface of the grown crystal, which creates the ohmic contact to the cap layer 6. A p-side electrode is formed on the rear surface of the GaAs substrate 1. When a D.C. voltage is applied between the n-side and p-side electrodes, the carrier is injected into the active layer 3 through the stripes 7 to conduct the laser emitting operation. The p-cladding layer 2, the active layer 3, and the optical guide layer 4 formed on the GaAs substrate 1 are common to each of the stripes 7. The n-cladding layer 5, and the cap layer 6 are divided into the stripes 7 by the high resistance layer 8. Therefore, the current is divided into plural paths.

Each stripe 7 forms the current confinement structure which defines each laser emitting region 9. The active layer 3 included in the laser emitting region 9 emits the laser beam. The regions disposed between the adjacent two laser emitting regions 9 function as optical coupling regions 10 where the laser beam is optically, phase coupled. The laser emitting region 9 and the optical coupling region 10 have refractive indexes of the real part only, which differ from each other. The refractive index difference should be greater than the reduction of the refractive index ($\sim 1.3 \times 10^{-3}$) caused by the current injection.

The optical guide layer 4 is provided for facilitating the control of the refractive index difference between the laser emitting region 9 and the optical coupling region 10, and for enhancing the optical coupling efficiency between the adjacent laser emitting regions 9. Theoretically, the optical guide layer 4 can be omitted.

Figure 3:
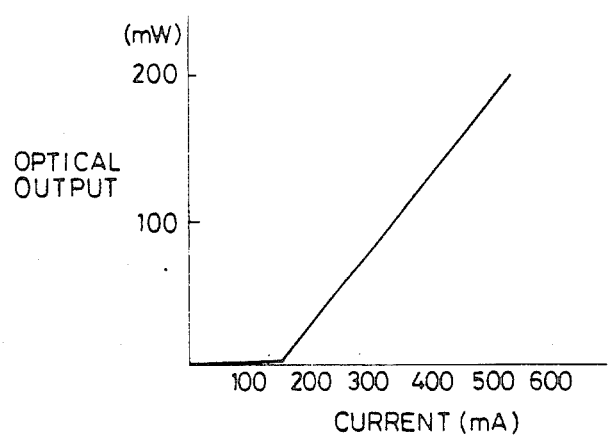
FIG. 3 is a graph showing the optical output characteristic of the semiconductor laser array of FIG. 2.
Figure 4:
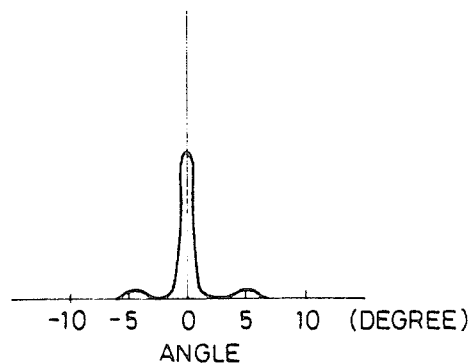
FIG. 4 is a graph showing the far field pattern obtained by the semiconductor laser array of FIG. 2.

A semiconductor laser array including five (5) stripes 7 is formed as an example. FIG. 3 shows the optical output characteristic of this example, and FIG. 4 shows the far field pattern of this example. FIG. 4 shows that each laser emitting region 9 is connected to the next laser emitting region 9 with the phase difference of zero degree.

The invention being thus described, it will be obvious that the same may be varied in many ways without departure from the spirit and scope of the invention, which is limited only by the following claims.

What is claimed is:

1. A semiconductor laser array having a stable operation and a high power output comprising:
a substrate;
a clad layer formed on said substrate;
an active layer formed on said substrate;
an optical guide layer formed on said active layer;
a plurality of mesa stripes formed on said optical guide layer, each mesa stripe being separated from the next mesa stripe by a groove extending into said optical guide layer, an optical coupling region having a high mole fraction in each said groove; and
current injection means for injecting current into said active layer through said plurality of mese stripes, wherein each laser emitting region defined by said mesa stripes is optically, phase connected to the next laser emitting region with a phase difference of zero degrees.

2. A GaAs semiconductor laser array comprising:
a p-GaAs substrate;
a p-Ga$_{1-x}$Al$_x$As cladding layer formed on said p-GaAs substrate;
a Ga$_{1-y}$Al$_y$As active layer formed on said p-Ga$_{1-x}$Al$_x$As cladding layer;
an n-Ga$_{1-z}$Al$_z$As optical guide layer formed on said Ga$_{1-y}$Al$_y$As active layer;
an n-Ga$_{1-x}$Al$_x$As cladding layer formed on said n-Ga$_{1-z}$Al$_z$As optical guide layer;
an n-GaAs cap layer formed on said n-Ga$_{1-x}$Al$_x$As cladding layer;
a plurality of stripe shaped grooves formed in said n-GaAs cap layer, n-Ga$_{1-x}$Al$_x$As cladding layer and said n-Ga$_{1-z}$Al$_z$As optical guide layer so that the bottom of each groove reaches the middle portion of said n-Ga$_{1-z}$Al$_z$As optical guide layer; and
a plurality of stripe shaped high resistance layers disposed in said plurality of stripe shaped grooves said laser array satisfying the relationship of
$y < z < x$.

3. The GaAs semiconductor laser array of claim 2, wherein each of said plurality of stripe shaped high resistance layers comprises a Ga$_{1-b}$Al$_b$As layer, where:

$$z < b.$$

4. The GaAs semiconductor laser array of claim 2 wherein an n-side electrode is formed on the surface which creates ohmic contact with the cap layer and a p-side electrode is formed on the rear surface of the substrate.

5. The GaAs semiconductor laser array of claim 2 containing laser beam emitting regions interrupted by optical coupling regions whereby the laser beam is optically phase coupled.

6. The GaAs semiconductor laser array of claim 4 wherein current injection means are provided for injecting current into the active layer.

7. The GaAs semiconductor laser array of claim 6 wherein the laser emitting regions have a different refractive index from said optical coupling regions in an amount greater than the reduction of the refractive index caused by current injection.

* * * * *